United States Patent
Liu et al.

(10) Patent No.: US 7,338,886 B2
(45) Date of Patent: Mar. 4, 2008

(54) IMPLANTATION-LESS APPROACH TO FABRICATING STRAINED SEMICONDUCTOR ON ISOLATION WAFERS

(75) Inventors: Jinping Liu, Beacon, NY (US); Dong Kyun Sohn, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 338 days.

(21) Appl. No.: 11/107,712

(22) Filed: Apr. 15, 2005

(65) Prior Publication Data

US 2006/0234479 A1   Oct. 19, 2006

(51) Int. Cl.
  *H01L 21/20*   (2006.01)
(52) U.S. Cl. ............... 438/483; 483/198; 483/933; 257/E21.09; 257/E21.092; 257/E21.461

(58) Field of Classification Search ............... 438/198, 438/933; 257/E21.092, E21.4, E21.461
See application file for complete search history.

(56) References Cited

U.S. PATENT DOCUMENTS

| 6,649,492 | B2 | 11/2003 | Chu et al. |
| 6,653,209 | B1 | 11/2003 | Yamagata |
| 6,723,541 | B2 | 4/2004 | Sugii et al. |
| 2003/0207545 | A1 | 11/2003 | Yasukawa |
| 2005/0003229 | A1* | 1/2005 | Bedell et al. ............... 428/641 |

* cited by examiner

*Primary Examiner*—Michael Lebentritt
*Assistant Examiner*—Cheung Lee
(74) *Attorney, Agent, or Firm*—Horizon IP Pte. Ltd.

(57) ABSTRACT

A method of fabricating a semiconductor substrate includes forming a buffer layer on the substrate. A Ge containing layer, such as a SiGe is formed over the buffer layer. The buffer layer includes defects at the interface of the substrate and buffer layer. The substrate is oxidized to transform the buffer layer to a buried oxide layer.

25 Claims, 4 Drawing Sheets

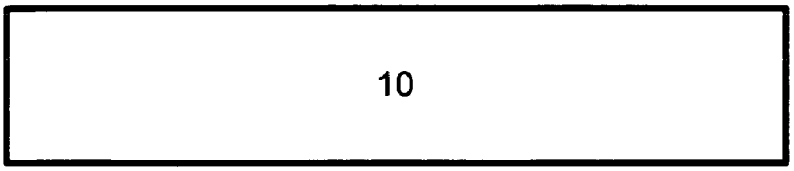
FIGURE 1
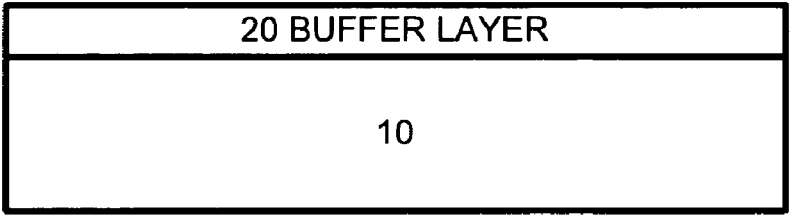
FIGURE 2
FIGURE 3
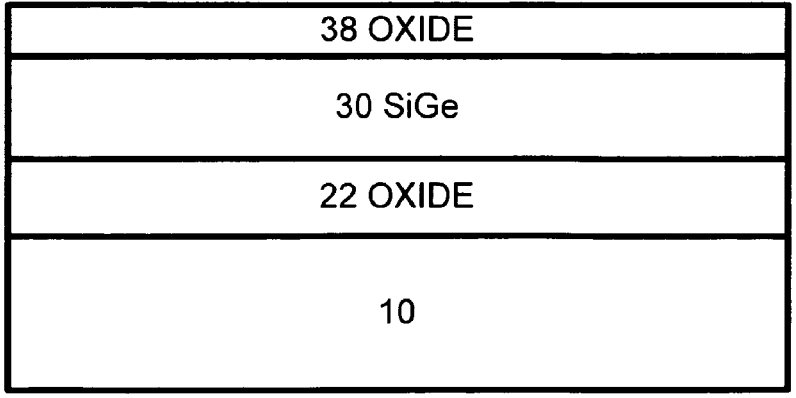
FIGURE 4

IMPLANTATION-LESS APPROACH TO FABRICATING STRAINED SEMICONDUCTOR ON ISOLATION WAFERS

CROSS REFERENCE TO RELATED APPLICATIONS

The following co-assigned applications are included herein by reference:

| Docket # | U.S. Ser. No. | US File date | Inventors | Title |
| --- | --- | --- | --- | --- |
| CS03-055 | 10/755,501 | Jan. 12, 2004 | Liu Jin Ping | SiGe Virtual substrate and method of fabricating the same |
| CS03-054 | 10/763,305 | Jan. 23, 2004 | Liu Jin Ping et al. | Method for forming a relaxed semiconductor buffer layer on a substrate with a large lattice mismatch |
| CS03-054 CIP | 10/865,433 | Jun. 10, 2004 | Liu Jin Ping et al. | Method for forming a relaxed semiconductor buffer layer on a substrate with a large lattice mismatch |

BACKGROUND OF THE INVENTION

1) Field of the Invention

This invention relates generally to the structure and fabrication of semiconductor devices and to a method of producing a silicon thin film, in particular, to a structure and method of forming a semiconductor on isolation wafer and more particularly to structure and method of forming a semiconductor on isolation wafer using strained layers.

2) Description of the Prior Art

There are various method for producing a SOI wafer. The SIMOX (Separation by IMplantation of OXygen) method uses a technique for forming a silicon oxide layer in a silicon substrate by implanting oxygen ions into the silicon substrate from its surface and then annealing the resultant substrate at a high temperature to form the silicon oxide layer at the portion where the oxygen ions have been implanted. In this method, the energy for implanting oxygen ions and the dose of the same cannot be set arbitrarily, but they are fixed to approximately constant conditions. Accordingly, it is difficult to set arbitrarily the thickness of the silicon film or that of the oxide film formed by ion implantation in the production of a SOI wafer.

The Eltran™ process by Canon uses a splitting water jet to split a bonded substrate structure.

Also, there are several types of semiconductor bonding method. The first one is referred to as "bonding and polishing SOI" method.

In the "bonding and polishing SOI" method, two silicon wafers at least one of which has been oxidized, are previously prepared, bonded to each other at room temperature and annealed, and then polished from its one side, to leave a silicon film of a desired thickness on the silicon oxide layer. According to this method, both the thickness of the silicon layer and that of the implanted oxide layer can be set arbitrarily. In this method, however, as means of making a thin film of a silicon layer are solely used grinding and polishing. Accordingly, it is difficult to obtain a thin film of a uniform several hundred nm thickness because the limitations of the original thickness accuracy and polishing accuracy in the silicon wafer.

As the measures to overcome the above difficulty, a technique for forming an ultrathin film (100 nm thick or less) uniformly in which thickness distribution of a SOI film is measured instantly and dry-etching is performed relatively heavily at regions where the film is rather thick while dry-etching is performed relatively lightly at regions where the film is rather thin has been reported. This technique is referred to as PACE (Plasma Assisted Chemical Etching). The PACE system includes two units separated from each other: a unit for measuring instantly thickness of a SOI film at in-plane multiple points (10000 points or more) and a unit for performing plasma etching. The unit for performing etching has a plasma generating portion in the form of a nozzle and is designed in such a manner that the nozzle can move over a wafer along its surface and generate plasma according to the measurements of the thickness of the SOI layer so as to etch, for example, the rather thick regions relatively heavily. This technique allows the control of the etching amount from region to region within the wafer surface and hence the control of the absolute value and uniformity of the film thickness. However, the surface having been subjected to plasma-assisted etching has etching damage remaining thereon; accordingly, in many cases, the surface of the SOI layer is subjected to polishing so as to remove its damaged layer. This polishing operation may cause non-uniformity again in the film thickness of the SOI layer which has just been made uniform.

The more relevant technical developments in the patent literature can be gleaned by considering the following.

U.S. Pat. No. 6,653,209 Yamagata—Method of producing silicon thin film, method of constructing SOI substrate and semiconductor device U.S. Pat. No. 6,649,492 Chu, et al.—Strained Si based layer made by UHV—CVD, and devices therein.

U.S. Pat. No. 6,723,541 —Sugii, et al.—shows a method of producing semiconductor device and semiconductor substrate.

U.S. 20030207545 A1—Yasukawa—An SOI substrate is provided with: a support substrate; a single crystal silicon layer disposed above one surface of the support substrate; an insulation portion disposed between the support substrate and the single crystal silicon layer, the insulation portion comprising a single layer of an insulation film or a lamination structure of a plurality of insulation films.

SUMMARY OF THE INVENTION

The example embodiments for the present invention provide a method for fabrication of a strained semiconductor on insulator substrates. An aspect comprises the following. We form a buffer layer over the substrate. The buffer layer can be comprised of one or more composite layers, such as SiGe layers. Then we form a SiGe layer on the buffer layer. Next, we perform an oxidation process to oxidize the buffer layer to form a buried isolation layer comprised of silicon oxide and oxidize the SiGe layer to form an oxide layer. The buffer layer has an enhanced oxidation rate compared to the SiGe layer because of the defects in the buffer layer. We remove the oxide layer. Then we form an upper semiconductor layer over the SiGe layer. Devices can be formed on the semiconductor layer.

The buffer layer reduces the amount of dislocations/defects between the Substrate and SiGe layer.

The substance of the claims in the issued patent hereby incorporated by reference into this summary of invention.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor substrate and further details of a process of fabricating such a substrate in accordance with the present invention will be more clearly understood from the following description taken in conjunction with the accompanying drawings in which like reference numerals designate similar or corresponding elements, regions and portions and in which:

FIGS. 1 thru 6 shows cross sectional views of a semiconductor device according to an example embodiment of the invention.

FIG. 2A-1 shows cross sectional views of a semiconductor device including a buffer layer according to an aspect of the example embodiment of the invention.

FIG. 2A-2 shows another cross sectional views of a semiconductor device including a buffer layer according to an aspect of the example embodiment of the invention.

FIG. 2A-3 shows another cross sectional views of a semiconductor device including a buffer layer according to an aspect of the example embodiment of the invention.

DETAILED DESCRIPTION OF THE EXAMPLE EMBODIMENTS

The example embodiments of the present invention will be described in detail with reference to the accompanying drawings. The example embodiments of the present invention provides a method of forming a strained semiconductor on insulator substrate. Embodiments of the invention provide structures and methods of fabrication of semiconductor substrate structure.

A. Substrate

Figures 1, 2A:
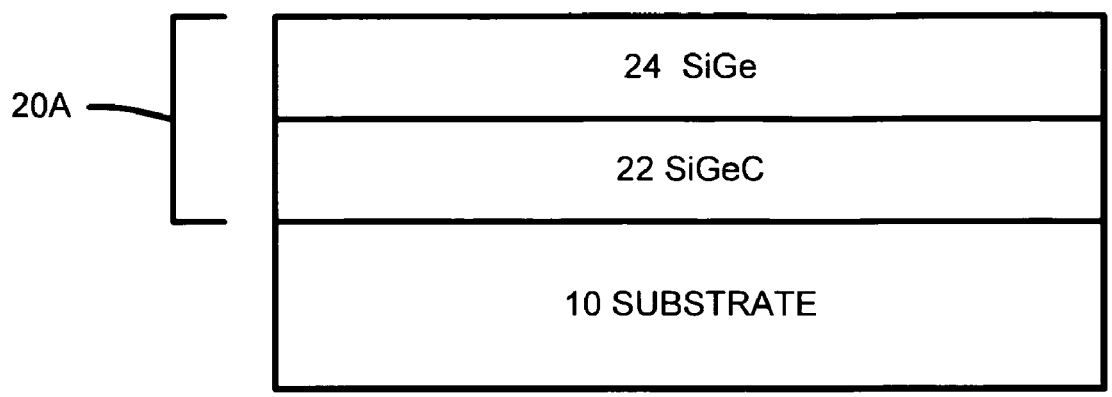

Referring to FIG. 1, a substrate is provided 10. The substrate is preferably comprised of silicon. The substrate is more preferably comprised of a crystalline silicon.

The substrate is preferably a p-type crystalline silicon substrate with a <100> crystallographic orientation. The substrate can be comprised of SiGe or GaAs.

B. Buffer Layer is Formed on the Substrate

Figures 2, 2A:
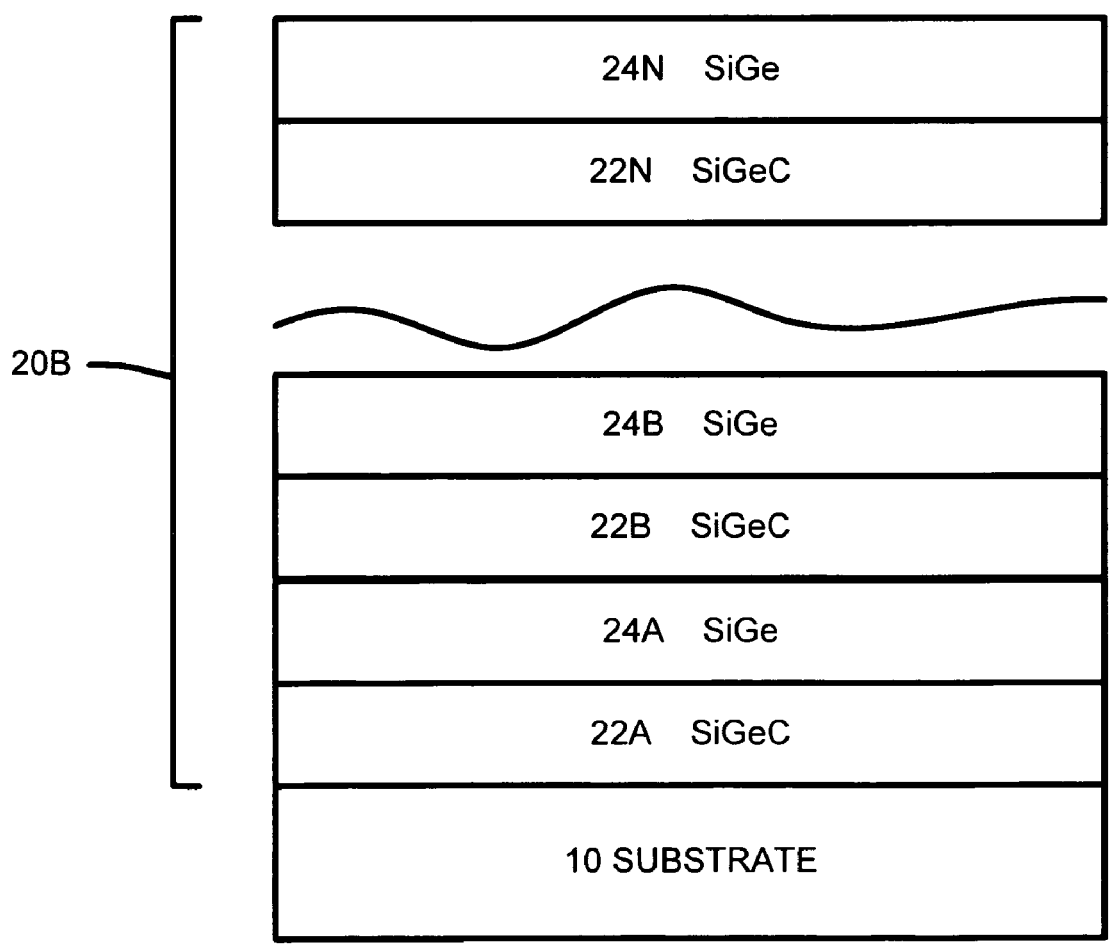

Referring to FIG. 2, a buffer layer 20 is formed over the substrate 10.

The key buffer layer (e.g., as disclosed in applicant's docket cases CS03-054 Ser. No. 10/763,305, CS03-054CIP Ser. No. 10/865,433; and CS03-055 Ser. No. 10//755,501 which are incorporated by reference) is comprised of: one or more composite layers preferably comprised of Si, Ge, and/or C. For example the buffer layer can be made of one or more layers of Si, SiGe, and/or SiGeC.

In an aspect of the embodiment, the buffer layer is comprised of one or more composite layers. The composite (bi-layer) layer is comprised of (a) a lower silicon-germanium-carbon layer and (b) an upper silicon-germanium layer.

Aspect 1—Buffer Layer (e.g., CS03-055)

For example, referring to FIG. 2A-1 (e.g., CS03-055) the buffer layer 20A is comprised of one or more composite layers. The composite layer is comprised of a lower silicon-germanium-carbon layer 22 and an upper silicon-germanium layer 24.

The lower silicon-Germanium-Carbon layer is preferably comprised of:

Si with between 62 and 79.5 atomic percent %; and more preferably between 75 and 79.5 atomic percent % Si; and Ge with between 20 and 35% atomic percent; and preferably between 18 and 25% atomic percent of Ge; and C with between 0.5 to 3.0 atomic % C; and more preferably between 1 to 2 atomic % C.

The lower silicon-Germanium-Carbon layer 22 preferably has a thickness between 20 and 500 Å.

The upper silicon-germanium layer 24 is preferably comprised of between 65 and 80 atomic percent Si; more preferably between 65 and 80 atomic percent Si; and of between 20 and 35 atomic percent % Ge.

The upper silicon-germanium layer 24 preferably has a thickness between 20 and 500 Å.

Aspect 2—buffer Layer 20B

Referring to FIG. 2A-2, in another embodiment, the buffer layer 20B is comprised of between 1 and 5 composite layers (for example SiGeC layer 22A, SiGe layer 24A, SiGeC Layer 22B, SiGe 24B, etc. SiGeC layer 22X and SiGe layer 24X).

Preferably, the composite layer are comprised of a lower silicon-Germanium-Carbon layer and a upper silicon-germanium layer.

The lower silicon-Germanium-Carbon layer is comprised of with between 62 and 79.5 atomic percent % Si; and of between 20 and 35% atomic percent of Ge; and of between 0.5 to 3.0 atomic % C.

The upper silicon-germanium layer is comprised of between 65 and 80 atomic percent Si; and of between 20 and 35 atomic percent % Ge.

Aspect 3—SiGe graded concentration Buffer layer 20C (e.g., CS03-054)

Figures 2, 2A, 3:
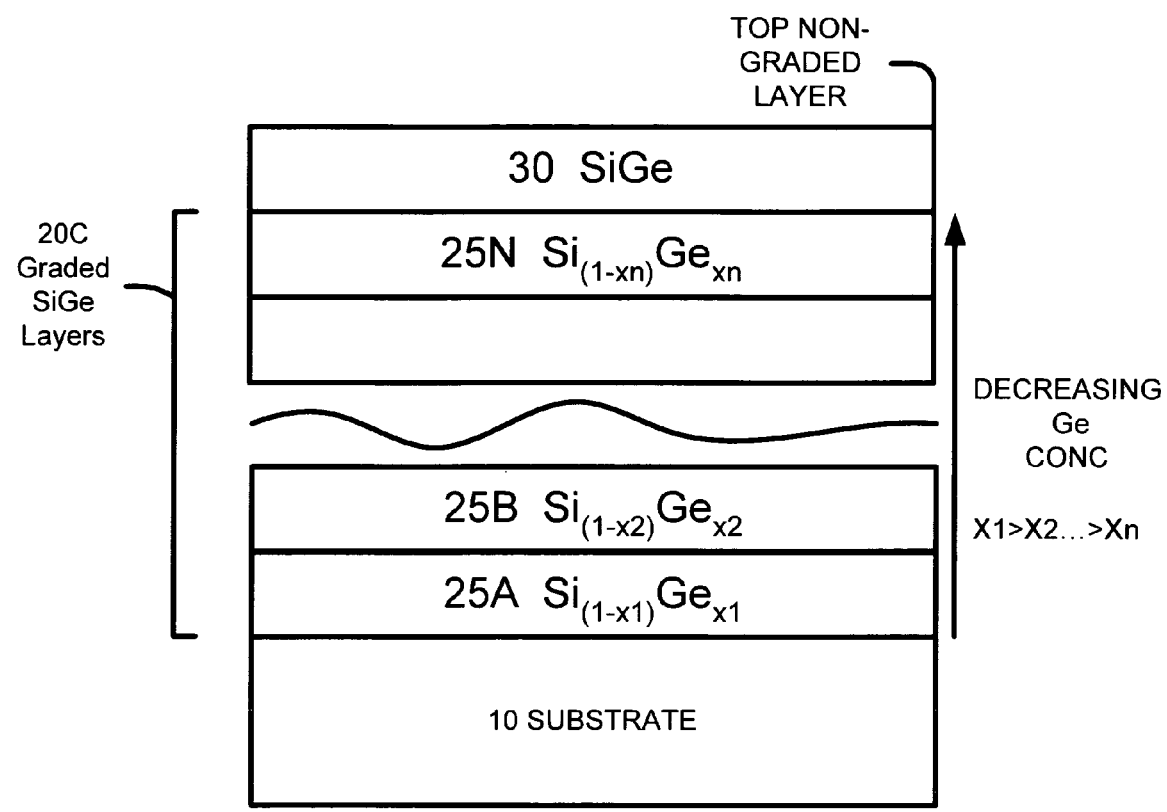

FIG. 2A-3 shows a cross sectional view of an embodiment for the buffer layer (20C) (e.g., graded $Si_{1-x}Ge_x$ layer 20C where the Ge concentration lowers as layer n increases). FIG. 2A-3 shows:

Substrate 10 (e.g., substrate is Si)

Graded SiGe Buffer layer 20C is comprised of "n" number of—$Si_{1-xn}Ge_{xn}$ layers where x is atomic percent/fraction and where : x1>x2>xn and SiGe layer 30 ($Si_{1-x}Ge_x$)—optionally SiGE 30 can have a uniform Ge concentration (non-graded).

layer 40

In an aspect, the buffer layer is comprised of a group of one or more SiGe alloy layers (portions) (1, 2, . . . n) denoted as $Si(1-x_n)Ge_{x_n}$ wherein $x_n$ is the content of the element in the SiGe Alloy n layer. The Ge concentration $Ge_{x_n}$ decreases as n goes from 1, 2, to n. The Ge concentration x decreases in subsequent SiGe alloy portions (e.g., layers) denoted by $x_1, x_2, \ldots x_n$; wherein $x_n$ is the fraction in the top SiGe alloy portion furthest away from the substrate surface 10; wherein x1 is greater than x2 . . . and $x_{n-1}$ greater than $x_n$; preferably wherein x is about between 0.0001 and 0.5.

In a preferred aspect, (layer n=1) $x_1$ is between 0.0001 and 0.5 and more preferably between 0.4 and 0.5 and $x_n$ is between 0.001 and 0.2 and more preferably between 0.01 and 0.5.

The buffer layer 20C is comprised of SiGe layers (1 to n) wherein the Ge composition increases from the substrate 10 surface towards to Si substrate. The total thickness of the graded SiGe layer can be between 300 and 1000 Angstroms, and more preferably 300 to 500 Angstroms.

Aspect 4-Buffer Layer

In another aspect, the buffer layer is comprised one layer of Si—Ge wherein the Ge concentration changes in the direction from the substrate 10 to the upper surface of the SiGe layer. The Ge concentration has a first value at the interface with the substrate and having a second value at top surface of the buffer (SiGe) layer. The first value of Ge concentration being larger than the second value. For example, the Ge concentration in the Buffer layer(s) increases towards the upper surface and decrease toward the substrate 10. The concentrations ranges can be as describe for the aspect shown in FIG. 2A-3.

C. Form a SiGE Layer

As shown in FIG. 3, we form a SiGe layer 30 on the novel buffer layer 20. The SiGe layer 30 is preferably a relaxed layer.

Misfit dislocations will preferably form at the interface between $Si_xGe_{1-x}$ layer 30 and Si substrate 10, and some threading dislocation will be formed in the SiGe layer, which is not desirable.

In order to decrease the number of such threading dislocations, novel buffer layers 20, (such as disclosed in related patent applications CS03-054, CS03-054CIP, CS03-055 which are herein incorporated by reference) can be placed between the $Si_xGe_{1-x}$ layer 30 and the substrate 10. Because of the thin buffer involved, the following oxidation step is possible to form a buried isolator layer without implantation.

The composition of the SiGe layer is chosen according to the targeted Ge composition needed in the final SGOI wafers. The thickness is chosen such that it is thicker than the critical thickness and the film will be partially relaxed. (FIG. 3)

Critical thickness, in heteroepitaxy, means a certain value exceeding which, the heteroepitaxial system can not maintain its coherence, i.e., some defects, for example misfit dislocation forms to relieve elastic strain in the system. The (relaxed) SiGe layer can have Ge composition of between 20 and 100 atomic percent, and more preferably between 20-25 atomic percent %. and preferably a thickness between 2000 and 10000 angstroms.

In an option shown in FIG. 2A-3, the SiGe layer 30 is a non-graded (constant Ge Concentration) layer. (See .e. g., CS04-054) Layer 40 is formed over layer 30.

D. Oxidize the Buffer Layer

As shown in FIG. 4, we perform an oxidation process (or anneal process) to oxidize the buffer layer 20 to form a buried isolation layer 22 preferably comprised of silicon oxide and oxidize the SiGe layer 30 to form an oxide layer 38.

The oxidation process is preferably performed in an oxygen containing atmosphere at a temperature greater that 1000° C. The oxidation process is preferably at temperature higher than 1000 C., preferably around 1350 C. and is preferably performed in an oxygen containing atmosphere.

The oxygen-containing atmosphere can be comprised of $O_2$ mixed with Ar, He, and other inert gases.

It is also possible that Ge composition in the SiGe layer 30 can be increased because of the selective oxidation of Si in the SiGe layer. Thus tuning the oxidation step allows tuning Ge composition in the final SGOI wafer, including pure Ge on isolator wafer. (FIG. 5)

The buffer layer 20 has defects preferably concentrated at the substrate/film interface that facilitate oxidation so that the buffer layer oxidizes much faster than the SiGe layer 30 surface. The strain relaxing defects are concentrated at the interface region when the SiGe buffer layer is grown for example as describe in CS03-054, CS03-054CIP and Cs03-054.

E. The Oxide Layer is Removed

Figure 5:
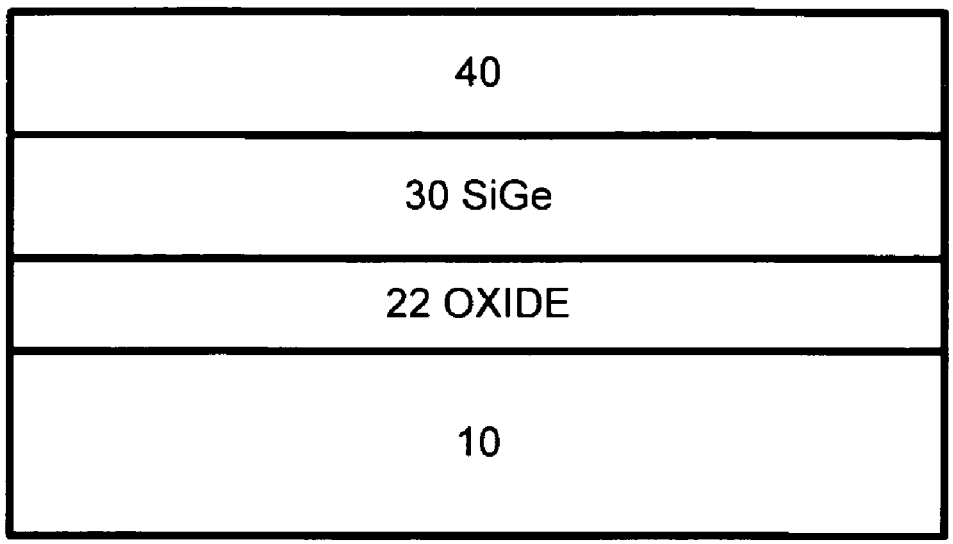

Referring to FIG. 5, the oxide layer 32 is removed preferably using an etch. Preferably a wet etch is used.

F. Upper Semiconductor Layer

Referring to FIG. 5, we form an upper semiconductor layer (e.g., Si, SiGe or Ge layer) 40 is formed on the SiGe layer. We preferably form the upper semiconductor layer (e.g., Si, SiGe or Ge layer) 40 using an epitaxial process. The upper semiconductor layer can be comprised of Si, SiGe or Ge.

For example, the upper semiconductor layer can be comprised of a Si epi layer to form strained SiOI wafer. The upper semiconductor layer can be comprised of a SiGe with Ge composition higher than that in SiGe Layer.

The upper semiconductor layer can be comprised of Ge epi to form strained SGOI (Si On Insulator) or GeOI (Ge On Insulator)wafer. (FIG. 5)

G. Form Devices

Figure 6:
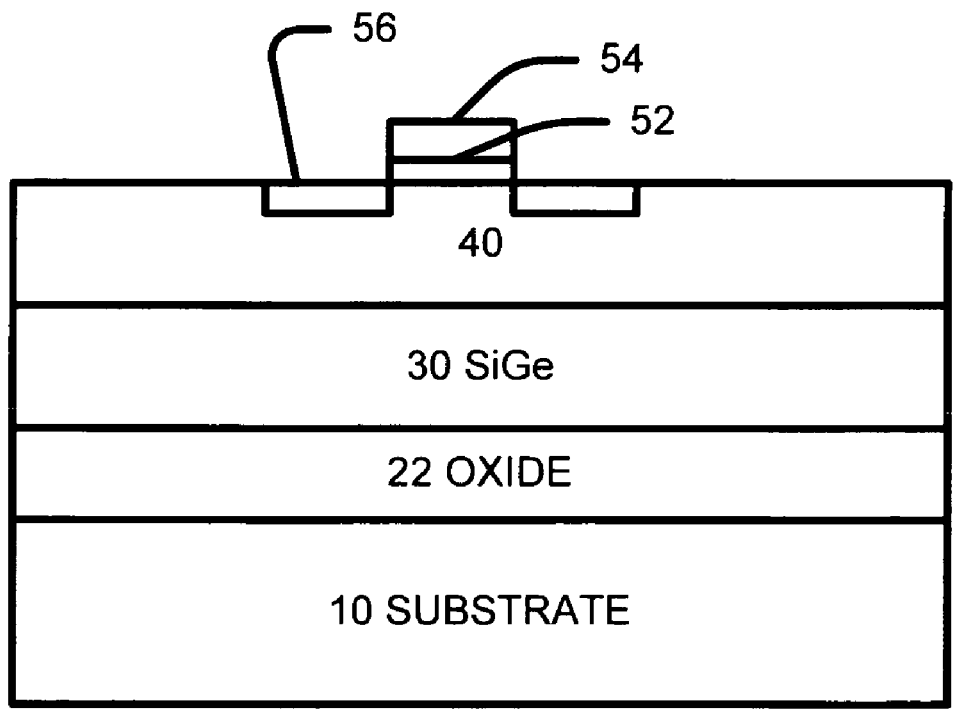

Referring to FIG. 6, next we form devices on the an upper semiconductor layer. For example as shown FIG. 6, a transistor comprised of source—drain regions 56, gate dielectric 52 and gate 54.

H. Non-Limiting Embodiments

In the above description numerous specific details are set forth in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word about or approximately preceded the value of the value or range.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a semiconductor device comprising:
   providing a substrate;
   forming a buffer layer on the substrate by epitaxial growth, wherein strain relaxing defects are concentrated at an interface region of the substrate and the buffer layer when the buffer layer is grown;
   forming a Ge containing layer on the buffer layer; and
   oxidizing the substrate to transform the buffer layer into an oxide layer.

2. The method of claim 1 wherein the strain relaxing defects formed during epitaxial growth, wherein the defects cause the buffer layer to oxidize faster than the Ge containing layer during oxidizing the substrate.

3. The method of claim 2 wherein the buffer layer comprises Ge, including SiGe and SiGeC.

4. The method of claim 2 wherein forming the buffer layer comprises forming a composite buffer layer, the composite buffer layer includes a plurality of sub-buffer layers, wherein adjacent sub-buffer layers have different materials selected from Si, SiGe and SiGeC.

5. The method of claim 4 wherein the sub-buffer layer adjacent to the substrate comprises SiGeC.

6. The method of claim 4 wherein the sub-buffer layers comprise alternating SiGe and SiGeC sub-buffer layers, and the sub-buffer layer adjacent to the substrate comprises SiGeC.

7. The method of claim 1 wherein forming the buffer layer comprises forming either:
   a SiGe alloy buffer layer having a graded concentration of Ge with highest concentration at its bottom adjacent to the substrate and lowest concentration at its top; or
   a composite buffer layer comprising a plurality of sub-buffer SiGe alloy layers with decreasing Ge concentrations, wherein a bottom sub-buffer layer adjacent to the substrate has higher or highest Ge concentration and a top sub-buffer layer has lower or lowest Ge concentration.

8. The method of claim 1 wherein the Ge containing layer comprises a Ge concentration of between 20 to 100 atomic %, the Ge containing layer includes SiGe or Ge.

9. The method of claim 8 wherein forming the buffer layer comprises either:
   forming a SiGe or SiGeC buffer layer;
   forming a composite buffer layer having a plurality of sub-buffer layers, wherein adjacent sub-buffer layers comprise different materials selected from Si, SiGe and SiGeC, wherein the sub-buffer layer adjacent to the substrate comprises SiGeC; or
   forming a composite buffer layer having a plurality of sub-buffer layers, wherein the sub-buffer layers comprise alternating SiGe and SiGeC sub-buffer layers with the sub-buffer layer adjacent to the substrate comprising SiGeC.

10. The method of claim 8 wherein forming the buffer layer comprises either:
    a SiGe alloy buffer layer having a graded concentration of Ge with highest concentration at its bottom adjacent to the substrate and lowest concentration at its top; or
    a composite buffer layer comprising a plurality of sub-buffer SiGe alloy layers with decreasing Ge concentrations, wherein a bottom sub-buffer layer adjacent to the substrate has higher or highest Ge concentration and a top sub-buffer layer has lower or lowest Ge concentration.

11. The method of claim 1 wherein the buffer layer comprises Ge, including SiGe and SiGeC.

12. The method of claim 1 wherein forming the buffer layer comprises forming a composite buffer layer, the composite buffer layer includes a plurality of sub-buffer layers, wherein:
    adjacent sub-buffer layers have different materials selected from Si, SiGe and SiGeC; or
    the sub-buffer layers comprise alternating SiGe and SiGeC sub-buffer layers.

13. The method of claim 12 wherein the sub-buffer layer adjacent to the substrate comprises SiGeC.

14. The method of claim 1 wherein forming the buffer layer comprises forming either:
    a SiGe alloy buffer layer having a graded concentration of Ge with highest concentration at its bottom adjacent to the substrate and lowest concentration at its top; or
    a composite buffer layer comprising a plurality of sub-buffer SiGe alloy layers with decreasing Ge concentrations, wherein a bottom sub-buffer layer adjacent to the substrate has higher or highest Ge concentration and a top sub-buffer layer has lower or lowest Ge concentration.

15. A method of fabrication of a semiconductor substrate structure comprising the steps of:
    a) providing a substrate; said substrate is preferably a p-type crystalline silicon substrate;
    b) forming a buffer layer on the Si substrate, said buffer layer is comprised of between 1 and 5 composite layers; said composite layers are comprised of a lower silicon-germanium-carbon (SiGeC) layer and an upper silicon-germanium layer (SiGe);
    c) forming a SiGe layer on the buffer layer;
    d) performing an oxidation process to oxidize the buffer layer to form a buried isolation layer comprised of silicon oxide and oxidize the SiGe layer to form an oxide layer;
    e) removing said oxide layer; and
    f) forming an upper semiconductor layer over the SiGe layer.

16. The method of claim 15 which further includes forming devices on said upper semiconductor layer.

17. The method of claim 15 wherein said lower SiGeC layer is comprised of between 62 and 79.5 atomic % of Si; and of between 20 and 35 atomic % of Ge; and of between 0.5 and 3.0 atomic % of C; and
    said upper SiGe layer is comprised of between 65 and 80 atomic % of Si; and of between 20 and 35 atomic % of Ge.

18. The method of claim 15 wherein the upper semiconductor layer comprises Si, SiGe or Ge, and is formed by an epitaxial process.

19. The method of claim 15 wherein the buffer layer has defects, the defects cause the buffer layer to oxidize faster than the SiGe layer during the oxidation process.

20. A method of fabrication of a semiconductor substrate structure comprising the steps of:
    a) providing a substrate said substrate is preferably a p-type crystalline silicon substrate with a <100> crystallographic orientation;
    b) forming a buffer layer on the Si substrate, said buffer layer is comprised of one or more SiGe alloy layers; said SiGe alloy layers are comprised of SiGe wherein said SiGe alloy layers have a varying Ge concentration in the thickness direction of said buffer layer, said Ge concentration having a first value at the interface with said substrate and having a second value at full thickness of said buffer layer, said first value of Ge concentration being larger than said second value of Ge concentration;

c) forming a SiGe layer on the buffer layer;

d) performing an oxidation process to oxidize the buffer layer to form a buried isolation layer comprised of silicon oxide and oxidize the SiGe layer to form an oxide layer;

e) removing said oxide layer;

f) forming an upper semiconductor layer over the SiGe layer; and g) forming devices on said upper semiconductor layer.

21. The method of claim 20 wherein said buffer layer is comprised of a group of one or more SiGe alloy layers (1, 2, . . . n) denoted as $Si(1-x_n)Ge_n$ wherein $x_1$ is the content of the element in said SiGe alloy layer located at the substrate surface and with decreasing x in subsequent SiGe alloy layers denoted by $x_2, \ldots x_n$; wherein $x_n$ is the fraction in the top SiGe alloy portion furthest away from said substrate surface; wherein $x_1$ is greater than $x_2$ and $x_{n-1}$ greater than $x_n$; wherein $x_n$ is about between about 0.0001 and 0.5; $x_1$ is between about 0.0001 and 0.5 and $x_n$ is between about 0.01 and 0.20.

22. The method of claim 21 wherein $x_1$ is between about 0.4 and 0.5 and $x_n$ is between about 0.01 and 0.05.

23. The method of claim 20 wherein said SiGe layer has a uniform Ge concentration.

24. The method of claim 20 wherein the upper semiconductor layer comprises Si, SiGe or Ge, and is formed by an epitaxial process.

25. The method of claim 20 wherein the buffer layer has defects, the defects cause the buffer layer to oxidize faster than the SiGe layer when oxidizing the substrate.

* * * * *